(12) United States Patent
Ye et al.

(10) Patent No.: US 10,879,041 B2
(45) Date of Patent: Dec. 29, 2020

(54) METHOD AND APPARATUS OF ACHIEVING HIGH INPUT IMPEDANCE WITHOUT USING FERRITE MATERIALS FOR RF FILTER APPLICATIONS IN PLASMA CHAMBERS

(71) Applicant: Applied Materials, Inc., Santa Clara, CA (US)

(72) Inventors: Zheng John Ye, Santa Clara, CA (US); Abdul Aziz Khaja, San Jose, CA (US); Amit Kumar Bansal, Milpitas, CA (US); Kwangduk Douglas Lee, Redwood City, CA (US); Xing Lin, San Jose, CA (US); Jianhua Zhou, Campbell, CA (US); Addepalli Sai Susmita, Bangalore (IN); Juan Carlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 15/214,063

(22) Filed: Jul. 19, 2016

(65) Prior Publication Data
US 2017/0069464 A1   Mar. 9, 2017

Related U.S. Application Data

(60) Provisional application No. 62/214,738, filed on Sep. 4, 2015.

(51) Int. Cl.
*H01J 37/32* (2006.01)
*C23C 16/509* (2006.01)
(Continued)

(52) U.S. Cl.
CPC ........ *H01J 37/32082* (2013.01); *C23C 16/50* (2013.01); *C23C 16/5096* (2013.01);
(Continued)

(58) Field of Classification Search
USPC ...... 118/723 E, 723 ER; 156/345.43–345.47; 315/111.21
See application file for complete search history.

(56) References Cited

U.S. PATENT DOCUMENTS 3,987,386 A * 10/1976 Valliere ............. H01F 5/00
336/20
4,236,127 A   11/1980 Scherba
(Continued)

FOREIGN PATENT DOCUMENTS

JP   2003509837 A   3/2003

OTHER PUBLICATIONS

International Search Report and Written Opinion for International Application No. PCT/US2016/043918 dated Oct. 26, 2016.

*Primary Examiner* — Rakesh K Dhingra
(74) *Attorney, Agent, or Firm* — Patterson + Sheridan, LLP

(57) ABSTRACT

Implementations of the present disclosure generally relate to methods and apparatus for generating and controlling plasma, for example RF filters, used with plasma chambers. In one implementation, a plasma processing apparatus is provided. The plasma processing apparatus comprises a chamber body, a powered gas distribution manifold enclosing a processing volume and a radio frequency (RF) filter. A pedestal having a substrate-supporting surface is disposed in the processing volume. A heating assembly comprising one or more heating elements is disposed within the pedestal for controlling a temperature profile of the substrate-supporting surface. A tuning assembly comprising a tuning electrode is disposed within the pedestal between the one or more heating elements and the substrate-supporting surface. The RF filter comprises an air core inductor, wherein at least one
(Continued)

of the heating elements, the tuning electrode, and the gas distribution manifold is electrically coupled to the RF filter.

19 Claims, 6 Drawing Sheets

(51) Int. Cl.
- *C23C 16/50* (2006.01)
- *H01L 21/67* (2006.01)
- *H01L 21/683* (2006.01)

(52) U.S. Cl.
CPC .. *H01J 37/32715* (2013.01); *H01L 21/67103* (2013.01); *H01L 21/6831* (2013.01); *H01J 2237/334* (2013.01); *H01L 21/67069* (2013.01)

(56) References Cited

U.S. PATENT DOCUMENTS

| | | | |
|---|---|---|---|
| 4,449,174 A | 5/1984 | Ziesse | |
| 5,534,751 A * | 7/1996 | Lenz | H01J 37/32623 315/111.71 |
| 5,982,100 A | 11/1999 | Ghanbari | |
| 6,339,364 B1 | 1/2002 | Reddy et al. | |
| 6,740,842 B2 | 5/2004 | Johnson et al. | |
| 7,148,783 B2 | 12/2006 | Parsche et al. | |
| 8,239,041 B2 | 8/2012 | Kondabatni et al. | |
| 9,041,364 B2 | 5/2015 | Khlat | |
| 2002/0175627 A1 | 11/2002 | Murao et al. | |
| 2003/0128092 A1 | 7/2003 | Maguire et al. | |
| 2004/0263307 A1 | 12/2004 | Christopherson et al. | |
| 2008/0188090 A1 | 8/2008 | Chen et al. | |
| 2008/0197780 A1 * | 8/2008 | Yamazawa | H01J 37/32091 315/111.21 |
| 2008/0262584 A1 | 10/2008 | Bottomley et al. | |
| 2009/0115562 A1 | 5/2009 | Lee et al. | |
| 2009/0236214 A1 * | 9/2009 | Janakiraman | C23C 16/45565 204/164 |
| 2010/0018648 A1 | 1/2010 | Collins et al. | |
| 2010/0114277 A1 | 5/2010 | Zhao et al. | |
| 2010/0318164 A1 | 12/2010 | Chen et al. | |
| 2013/0126513 A1 * | 5/2013 | Marakhtanov | H05B 7/18 219/383 |
| 2014/0034239 A1 * | 2/2014 | Yang | H01J 37/32082 156/345.28 |
| 2014/0083361 A1 * | 3/2014 | Rocha-Alvarez | H01J 37/32091 118/723 E |
| 2014/0087489 A1 * | 3/2014 | Rocha-Alvarez | H01J 37/32532 438/5 |
| 2014/0263177 A1 | 9/2014 | Povolny et al. | |
| 2014/0263181 A1 | 9/2014 | Park | |
| 2014/0302256 A1 | 10/2014 | Chen et al. | |
| 2015/0228456 A1 | 8/2015 | Ye et al. | |

* cited by examiner

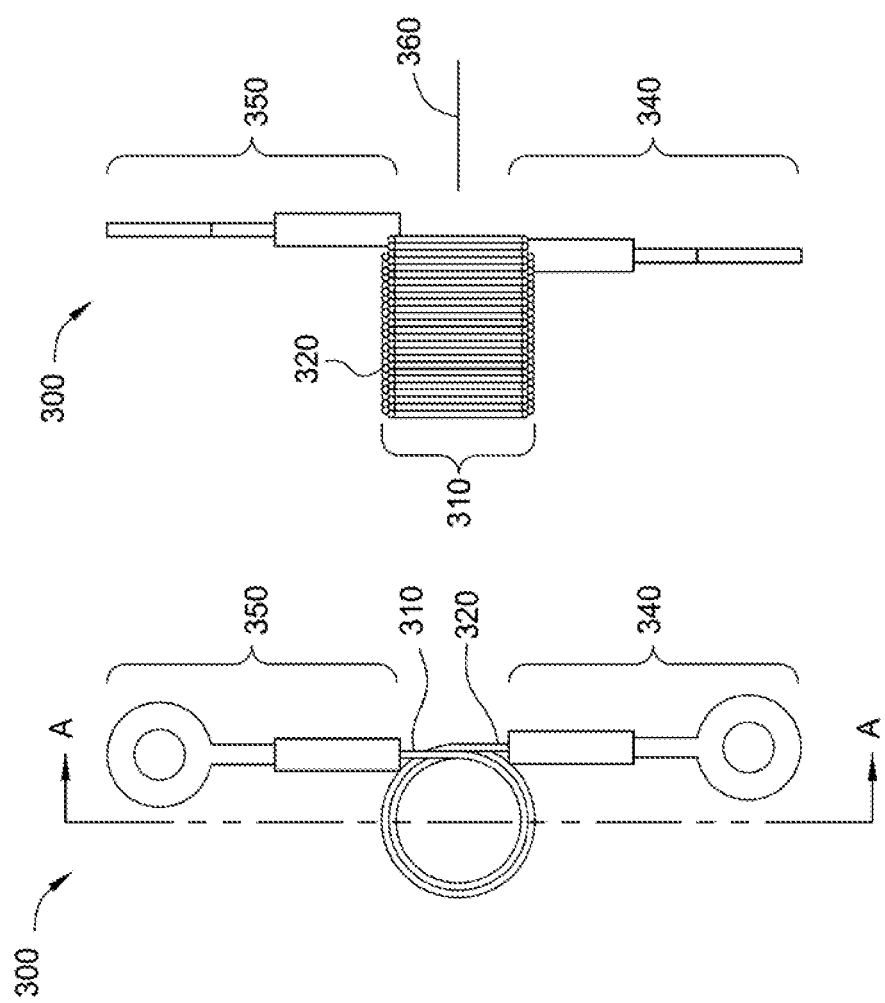
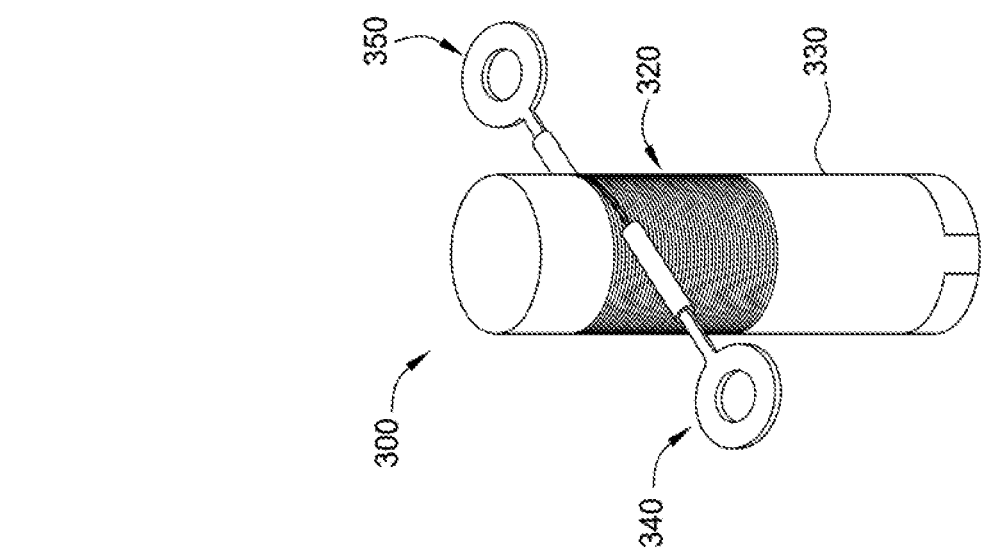

METHOD AND APPARATUS OF ACHIEVING HIGH INPUT IMPEDANCE WITHOUT USING FERRITE MATERIALS FOR RF FILTER APPLICATIONS IN PLASMA CHAMBERS

CROSS-REFERENCE TO RELATED APPLICATIONS

This application claims benefit of U.S. provisional patent application Ser. No. 62/214,738, filed Sep. 4, 2015. The aforementioned related patent application is herein incorporated by reference in its entirety.

BACKGROUND

Field

Implementations described herein generally relate to an apparatus and method for processing substrates. More particularly, the present disclosure relates to methods and apparatus for generating and controlling plasma, for example RF filters, used with plasma chambers. The methods and apparatus can be applied to semiconductor processes, for example, plasma deposition and etch processes and other plasma processes used to form integrated circuits.

Description of the Related Art

In the manufacture of integrated circuits and other electronic devices, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes. Thus, PECVD is advantageous for integrated circuit fabrication with stringent thermal budgets, such as for very large scale or ultra-large scale integrated circuit (VLSI or ULSI) device fabrication.

One problem encountered with plasma processing in integrated circuit fabrication is that devices may become damaged because of exposure to non-uniform plasma conditions, such as electric field gradients. The susceptibility or degree of device damage depends on the stage of device fabrication and the specific device design. Devices containing an insulating or dielectric layer deposited on a substrate are susceptible to damage due to charges and/or potential gradients accumulating on the surface of the dielectric layer.

Therefore, there is a need for an improved methods and apparatus for plasma processing.

SUMMARY

Implementations described herein generally relate to an apparatus and method for processing substrates. More particularly, the present disclosure relates to methods and apparatus for generating and controlling plasma, for example RF filters, used with plasma chambers. The methods and apparatus can be applied to semiconductor processes, for example, plasma deposition and etch processes and other plasma processes used to form integrated circuits. In one implementation, a plasma processing apparatus is provided. The plasma processing apparatus comprises a chamber body, a powered gas distribution manifold enclosing a processing volume and a radio frequency (RF) filter. A pedestal having a substrate-supporting surface is disposed in the processing volume. A heating assembly comprising one or more heating elements is disposed within the pedestal for controlling a temperature profile of the substrate-supporting surface and/or substrate if present. A tuning assembly comprising a tuning electrode is disposed within the pedestal between the one or more heating elements and the substrate-supporting surface. The RF filter comprises an air core inductor, wherein at least one of the heating elements, the tuning electrode, and the gas distribution manifold is electrically coupled to the RF filter.

In another implementation, a substrate support assembly is provided. The substrate support assembly comprises a substrate support pedestal having a substrate-supporting surface, a heating assembly comprising one or more heating elements disposed within the pedestal for controlling a temperature profile of the substrate-supporting surface and substrate if present, a tuning assembly comprising a tuning electrode that is disposed within the pedestal and a radio frequency (RF) filter. The RF filter comprises and an air core inductor, wherein at least one of the heating elements and the tuning electrode is electrically coupled to the RF filter.

In yet another implementation, a substrate support assembly is provided. The substrate support assembly comprises a substrate support pedestal having a substrate-supporting surface, a heating assembly comprising one or more heating elements disposed within the substrate support pedestal for controlling a temperature profile of the substrate-supporting surface and substrate if present, a tuning assembly comprising a tuning electrode that is disposed within the substrate support pedestal, and a radio frequency (RF) filter comprising an air core inductor. The air core inductor comprises a first helical coil section having a predetermined number of coil turns and a second helical coil section having a predetermined number of coil turns and positioned to overlap the first helical coil section both axially and radially so that the air core inductor is resonant at a predetermined frequency. The first helical coil section and the second helical coil section share a common longitudinal axis. At least one of the heating elements and the tuning electrode is electrically coupled to the RF filter. The RF filter comprises at least two of the air core inductors connected in series.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

FIG. 3 is a perspective view of an air core inductor according to one implementation described herein;

FIG. 4 is a top view of the air core inductor of FIG. 3 according to one implementation described herein;

FIG. 5 is a cross-section view of the air core inductor of FIG. 4 taken along line A-A according to one implementation described herein;

Figure 1:
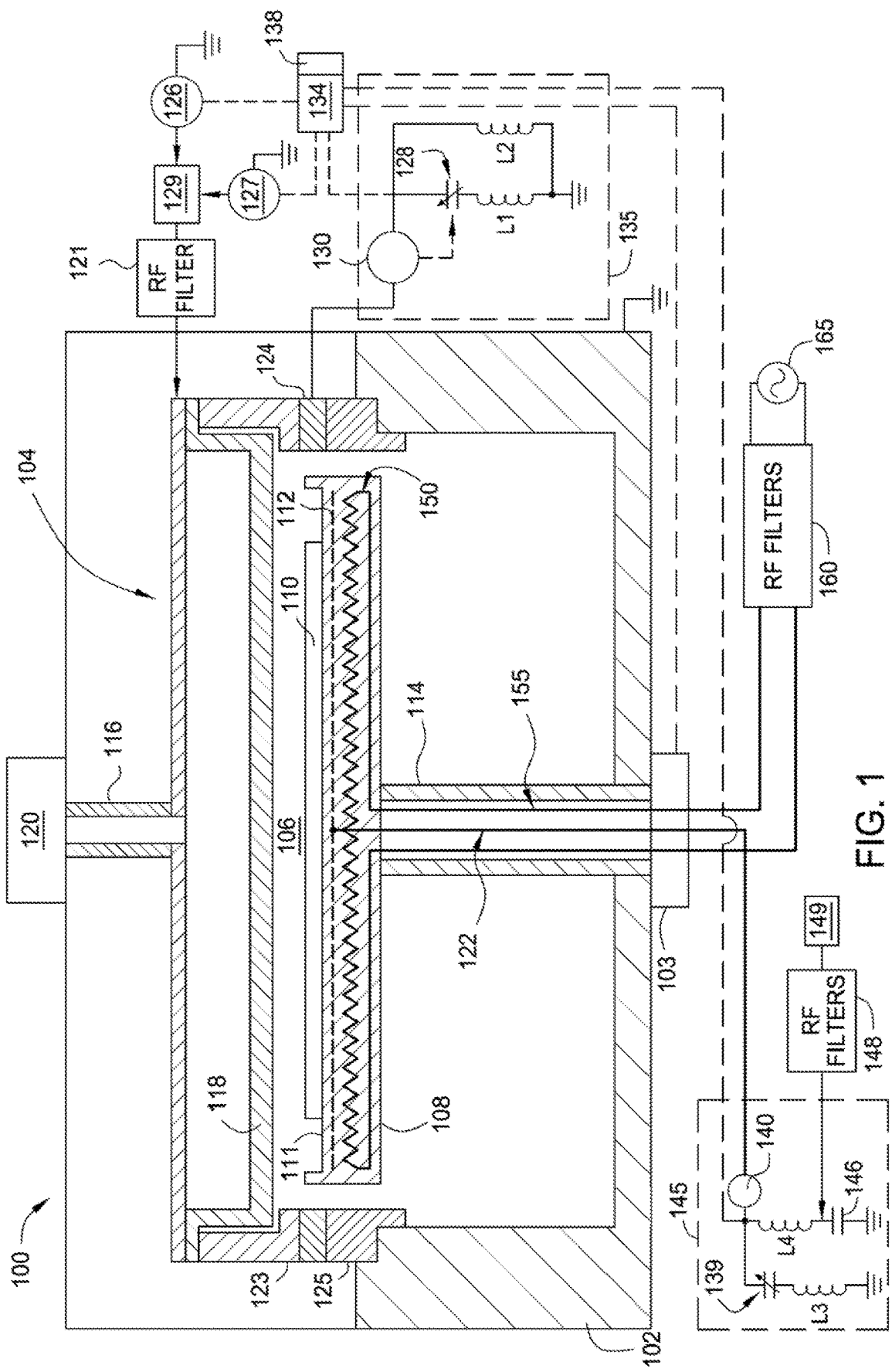
FIG. 1 is a schematic view of a plasma processing apparatus, incorporating an RF filter according to one implementation described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes methods and apparatus for generating and controlling plasma, for example RF filters, used with plasma chambers. Certain details are set forth in the following description and in FIGS. 1-9 to provide a thorough understanding of various implementations of the disclosure. Other details describing well-known structures and systems often associated with RF filters and plasma chambers are not set forth in the following disclosure to avoid unnecessarily obscuring the description of the various implementations.

Many of the details, dimensions, angles and other features shown in the figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a PECVD process that can be carried out using any suitable thin film deposition or etching system. Examples of suitable systems include the CENTURA® systems which may use a DxZ™ processing chamber, PRECISION 5000® systems, PRODUCER™ systems, PRODUCER GT™ and the PRODUCER SE™ processing chambers which are commercially available from Applied Materials, Inc., of Santa Clara, Calif. Other tools capable of performing PECVD or etch processes may also be adapted to benefit from the implementations described herein. In addition, any system enabling the PECVD or etch processes described herein can be used to advantage. The apparatus description described herein is illustrative and should not be construed or interpreted as limiting the scope of the implementations described herein.

As used herein, the term "air core inductor coil" describes an inductor that does not depend upon a ferromagnetic material to achieve its specified inductance. This covers the case where there is just air inside as well as windings upon a different insulator such as, for example, Bakelite, glass, polyether ether ketone (PEEK), or polytetrafluoroethylene (PTFE).

Implementations described herein include methods and apparatus to accommodate the RF filtering requirements typically seen in plasma enhanced chemical vapor deposition chambers and etch chambers where RF power is used to produce and sustain plasmas with substantially uniform characteristics including plasma density and temperature. More particularly, implementations of the present disclosure address the electrical noise of the RF interferences originating from the plasma which may couple to a variety of chamber and system parts adversely effecting chamber operations. One example of RF interference is the RF noise coupled through a heater to an electrostatic chucking power supply which could adversely affect wafer chucking quality. Another example is the RF power coupling through the heater elements into the AC heating circuitry at the ground potential. These and other types of RF coupling typically come in an uncontrolled and unexpected manner leading to degradation of the tool performance, or in extreme cases equipment and system damage. For example, an off-the-shelf DC power supply is usually not designed to handle a load other than the DC, and an AC line power supporting the heater elements is not designed to handle a load other than the 60 Hz frequency. Once these loads receive reflected power at RF frequencies such as those at 350 KHz, 13.56 MHz, and others, a standing wave will establish on the loads resulting in damaging high voltage build-up. RF filters are used to block these reflected signals while allowing for the designed DC or 60 Hz signal to operate normally.

RF filters are usually characterized by their impedance at one particular, or multiple RF frequencies simultanuously, which need to meet specifications for adequate blocking at the chosen operating frequencies. An RF filter having a low or insufficiently high RF impedance would allow the RF current to pass through to reach the devices the RF filter is designed to protect. Another characteristic of an RF filter is its mechanical dimension and energy consumption. Previous RF filter designs employed lumped circuit elements such as inductors alone, capacitors alone, and certain combinations of the inductors and capacitors, either in series or in parallel to form certain resonant circuitry in order to reach the designed electrical and mechanical specifications. These previous RF filter designs typically result in physically large devices when high impedance is desired, or present as a low ratio of the impedance over physical dimension. This is due to the capacitors involved in the designs that are large in dimension, or inductors that are large when the operating frequency is low.

Ferrite materials are often used as the core material for inductor coils in order to achieve sufficiently high impedance values. However, ferrite materials are sources of dielectric loss depending upon the operating frequency, and their electrical properties may be temperature dependent which is affected by the RF loss itself. Thus, avoiding the use of ferrite materials in RF filters operating at high RF powers and multiple RF frequencies is desirable.

Implementations of the present disclosure provide compact RF filters and methods of constructing compact RF filters at a single operating RF frequency or multiple operating frequencies without the use of lumped element capacitors and ferrite materials. The RF filter devices of the present disclosure exhibit a high ratio of impedance over physical dimensions at a single operating RF frequency or multiple RF frequencies which have not been achieved by prior art devices. The results achieved by the RF devices described herein are particularly desirable in applications wherein there is a space limitation, a weight limitation, or both. Exemplary applications include semiconductor manufacturing equipment where there is high demand for packaging and integration where there are space and weight limitations.

The cost reduction achieved due to the superior impedance and physical dimension ratio provides additional competitive advantanges.

Implementations of the present disclosure, address the deficiencies of lumped element filters associated with capacitors, inductors, or both capacitors and inductors in constructing an RF filter, by taking advantage of the self resonant nature of an air core inductor structure design. Implementations described herein achieve high input impedance at desired operating frequencies ranging as low as 50 to 60 Hz, to radio frequency, very high frequency, and microwave frequency, and in low physical form factor.

Implementations of the present disclosure include methods of constructing RF filters using insulated or enameled wires to form helix like inductor coils on a non-magnetic dielectric core material. The RF filters described herein exhibit desirable characteristics and specifications including but not limited to their frequency responses and input impedance at one or multiple frequencies that are used to initiate and sustain plasmas under RF power in plasma deposition and etching tools. The frequency response of the RF filters described herein may comprise of for example, low-pass, high-pass, and band-pass characteristics; and their input impedance may be high, low, or at any specific magnitude demanded by the system requirements. The RF filters described herein may operate in one frequency or multiple frequencies in the range from 50 Hz to 2450 MHz, under a desired power level. The RF filters described herein may exhibit extremely high input impedance at one or multiple operating frequencies where extremely high impedance presents to the system components as an open circuit in a practical sense from which no, or very low current is drawn, and the devices which the RF filters are designed to protect may appear invisible electrically to the main system components.

In one implementation, the RF filters described herein are constructed with helix-like coil windings. The desired frequency response and input impedance are achieved by controlling at least one of the following parameters during the coil forming process, these parameters include but are not limited to: the coil diameter in implementations where a wire having a circular cross-section is used, edge length in implementations where a wire having a rectangular cross-section is used, and in case of arbitrary cross-section its shape and area, its length, conductivity, the number of the stack layers, the number of turns of each layer, the pitch both along the length and along the radial direction of the helix coil formation, the core material and geometry where the core material may be that of the air, or materials having relative magnetic permeability of one, that is, non-ferrite materials. The RF filters described herein consist of a plural number of layers (e.g., two or more layers) forming a stack of helix coils such that mutual electromagnetic field coupling between the neighboring coils are enhanced resulting in desired mutual capacitance and inductance distributed per turn and among all turns, and thereoff desired resonant frequency, or frequencies, without capacitors of lumped elements that are typically used.

FIG. 1 is a schematic side cross-sectional view of a plasma processing apparatus including an RF filter, according to one implementation described herein. The apparatus includes a chamber 100 in which one or more films may be deposited on or etched from a substrate 110 disposed on a substrate support pedestal 108. The substrate support pedestal 108 has a substrate-supporting surface 111 for supporting the substrate 111. The chamber 100 includes a chamber body 102 and a gas distribution assembly 104, which distributes gases uniformly into a process volume 106. The substrate support pedestal 108, hereafter pedestal 108, is disposed within the process volume 106 and supports the substrate 110. The pedestal 108 includes a heating element 150. The pedestal 108 is movably disposed in the process volume 106 by a stem 114 that extends through the chamber body 102, where the stem 114 is connected to a drive system 103 and bellows to allow the pedestal 108 to be raised, lowered, and/or rotated.

The gas distribution assembly 104 includes a gas inlet passage 116, which delivers gas from a gas flow controller 120 into a gas distribution manifold 118. The gas distribution manifold 118 includes a plurality of holes or nozzles (not shown) through which gaseous mixtures are injected into the process volume 106 during processing.

A high frequency RF power source 126 and a low frequency RF power source 127 provide electromagnetic energy through a match circuit 129 to power the gas distribution manifold 118, which acts as an RF powered electrode, to facilitate generation of a plasma within the process volume 106 between the gas distribution manifold 118 and the pedestal 108. An RF filter 121 having an air core inductor as described herein may be positioned between the gas distribution assembly 104 and the high frequency RF power source 126 and the low frequency RF power source 127. The RF filter 121 is generally configured to block RF energy from reaching the high frequency RF power source 126 and the low frequency RF power source 127.

The pedestal 108 includes a tuning electrode 112, which is electrically grounded through an RF rod 122, such that an electric field is generated in the chamber 100 between the powered gas distribution manifold 118 and the tuning electrode 112. In one implementation, the tuning electrode 112 comprises a conductive mesh, such as a tungsten or molybdenum containing mesh that is disposed within the dielectric material that is used to form the pedestal 108. In one configuration, the pedestal 108 includes a ceramic material, such as aluminum nitride (AlN), silicon nitride (SiN), silicon carbide (SiC) or the like.

A ceramic ring 123 is positioned below the gas distribution manifold 118. Optionally, a tuning ring 124 is disposed between the ceramic ring 123 and an isolator ring 125, which electrically isolates the tuning ring 124 from the chamber body 102. The tuning ring 124 is typically made from a conductive material, such as aluminum, titanium, or copper. As depicted in FIG. 1, the optional tuning ring 124 is positioned concentrically about the pedestal 108 and substrate 110 during processing of the substrate 110. The tuning ring 124 is electrically coupled to an RF tuner 135, which includes a variable capacitor 128, such as a variable vacuum capacitor, that is terminated to ground through an inductor L1. RF tuner 135 also includes a second inductor L2 that is electrically coupled in parallel to the variable capacitor 128 to provide a path for low frequency RF to ground. RF tuner 135 also includes a sensor 130, such as a voltage/current (V/I) sensor, that is positioned between the tuning ring 124 and the variable capacitor 128 for use in controlling the current flow through the tuning ring 124 and the variable capacitor 128.

The tuning electrode 112 formed in the pedestal 108 is electrically coupled through RF rod 122 to an RF tuner 145, which includes a variable capacitor 139, such as a variable vacuum capacitor, that is terminated to ground through an inductor L3. RF tuner 145 also includes a second inductor L4 and a capacitor 146 that is electrically coupled in parallel to the variable capacitor 139 to provide a path for low frequency RF to ground. RF tuner 145 also includes a sensor 140, such as a V/I sensor, that is positioned between the tuning electrode 112 and the variable capacitor 139 for use in controlling the current flow through the tuning electrode 112 and the variable capacitor 139.

The RF rod 122 couples the tuning electrode 112 to a power supply 149 via RF tuner 145 and RF filter 148. The RF filter 148 may contain an air core inductor as described herein. The RF filter 148 is generally configured to block RF energy from reaching the power supply 149. The power supply 149 may include a direct current (DC) power source, an alternating current (AC) power source, or a combination of both. In one embodiment, the power supply 149 is an alternating current (AC) power source to provide AC signal to the tuning electrode 112. The configuration of RF filter 148 will be further discussed in detail below.

One or more heating elements 150 are disposed within the pedestal 108 and are used to control a temperature profile across the substrate-supporting surface 111 and across the substrate 110 if present. As depicted, the heating elements 150 may be disposed beneath the tuning electrode 112; in other words, the tuning electrode 112 is disposed closer to the substrate than the heating elements 150. The heating elements 150 generally provide resistive heating to the substrate 110. The heating elements 150 may be comprised of any feasible material, such as a conductive metal wire (e.g., refractory metal wire), patterned metal layer (e.g., molybdenum, tungsten or other refractory metal layer) or other similar conductive structure. The heating elements 150 are connected to one or more conductive rods 155, which may extend along the length of the stem 114 of the pedestal 108. In one implementation, the conductive rods 155 are positioned parallel to or substantially parallel to the RF rod 122. The conductive rods 155 couple the heating elements 150 to a heating power source 165, through one or more RF filters 160. RF filters 160 may contain an air core inductor as described herein. The RF rod 122 and conductive rod 155 are generally solid conductive elements (e.g., moderate diameter solid wire, non-stranded wire) that are formed from a conductive material, such as copper, nickel, gold, coated aluminum, and a refractory metal or other useful material. The RF filters 160 are generally configured to block RF energy from reaching the heating power source 165. The configuration of the RF filters 160 will be discussed in further detail below. In one implementation, the heating power source 165 provides a non-RF, alternating current (AC) power to the heating elements 150. For example, the heating power source 165 may provide three-phase AC power at a frequency of approximately 60 Hertz.

A system controller 134 controls the functions of the various components, such as the RF power sources 126 and 127, the drive system 103, the variable capacitors 128 and 139, power supply 149, and heating power source 165. The system controller 134 executes system control software stored in a memory 138. The system controller 134 comprises parts of or all of one or more integrated circuits (ICs) and/or other circuitry components. The system controller 134 may in some cases include a central processing unit (CPU) (not shown), memory (not shown), and support circuits (or I/O) (not shown). The CPU may be one of any form of computer processor that is used for controlling various system functions and support hardware and monitoring the processes being controlled by and within the chamber 100. The memory is coupled to the CPU, and may be one or more of a readily available memory, such as random access memory (RAM), read only memory (ROM), floppy disk, hard disk, or any other form of digital storage, local or remote. Software instructions (or computer instructions) and data may be coded and stored within the memory for instructing the CPU. The software instructions may include a program that determines which tasks are to be performed at any instant in time. The support circuits are also connected to the CPU for supporting the processor in a conventional manner. The support circuits may include cache, power supplies, clock circuits, timing circuits, input/output circuitry, subsystems, and the like.

In the plasma processing apparatus, chamber 100, an RF path is established between the powered gas distribution manifold 118 and the tuning electrode 112 via plasma. Further, by changing the capacitance of the variable capacitor 139, the impedance for the RF path through the tuning electrode 112 changes, in turn, causing a change in the RF field coupled to the tuning electrode 112 and a change in the RF return current through the tuning electrode 112 and the RF rod 122. Therefore, the plasma in the process volume 106 may be modulated across the surface of the substrate 110 during plasma processing. Controlling the RF field and modulating the RF return current may thus result in higher processing rate in depositing films onto or etching material from the substrate 110 with improved center-to-edge deposition thickness uniformity or etch removal uniformity.

Further, an additional RF path is established between the powered gas distribution manifold 118 and the tuning ring 124. Additionally, by changing the capacitance of the variable capacitor 128, the impedance for the RF path through the tuning ring 124 changes, in turn, causing a change in the RF field coupled to the tuning ring 124. For example, a maximum current and corresponding minimum impedance of the tuning ring 124 can be achieved by varying the total capacitance of the variable capacitor 128. Therefore, the plasma in the process volume 106 may also be modulated across the surface of the substrate 110 using this additional RF path.

During operation of the plasma processing apparatus, RF energy is normally delivered to a top, powered electrode (i.e., the powered gas distribution manifold 118), coupled through the plasma formed in the process volume 106 and the substrate 110 and mainly returned through the wall of the chamber body 102 and/or tuning electrode 112 to ground. Since the heating elements 150 may be embedded beneath the tuning electrode 112, RF energy can capacitively couple through the ceramic materials to the heating elements (i.e., RF leakage). The RF leakage to these undesired paths, such as heating elements and AC lines, not only affects the substrate processing results (i.e., deposition rate and uniformity on the substrate) but also cause electromagnetic interference (EMI) on or damage to the heating element AC power sources.

By adjusting the RF tuner 145 (and especially variable capacitor 139) to compensate for the net reactance caused by other tuning assembly components (e.g., tuning electrode 112, RF rod 122) at an operating frequency of the powered gas distribution manifold, a minimum impedance path through the tuning assembly may be provided to ground. Thus, a greater proportion of RF energy will be coupled through this path, which includes the tuning electrode, RF rod 122 and RF tuner 145, with less RF leakage into other components of the plasma processing apparatus. The minimum impedance path provides greater efficiency as well as greater control of the application of RF energy for depositing films onto or etching material from the substrate. However, typically due to the need to use a mesh type of tuning electrode 112 within the pedestal 108 for manufacturing reasons, and the need to position the heating elements 150 near the substrate-supporting surface 111 of the pedestal 108, unavoidably an amount of the RF energy provided to the process volume 106 leaks to the heating elements 150.

Conversely, the RF filters 160 may be included in the heating assembly to provide a relatively greater impedance path to ground to minimize the amount of RF leakage to the heating elements 150. The RF filters 160 may be inserted in between the heating elements 150 and the corresponding AC source(s) to attenuate RF energy and to suppress RF leakage current. In some configurations, the impedance of the tuning electrode 112 to ground is substantially less than the impedance of the heating elements 150 to ground.

Figure 2:
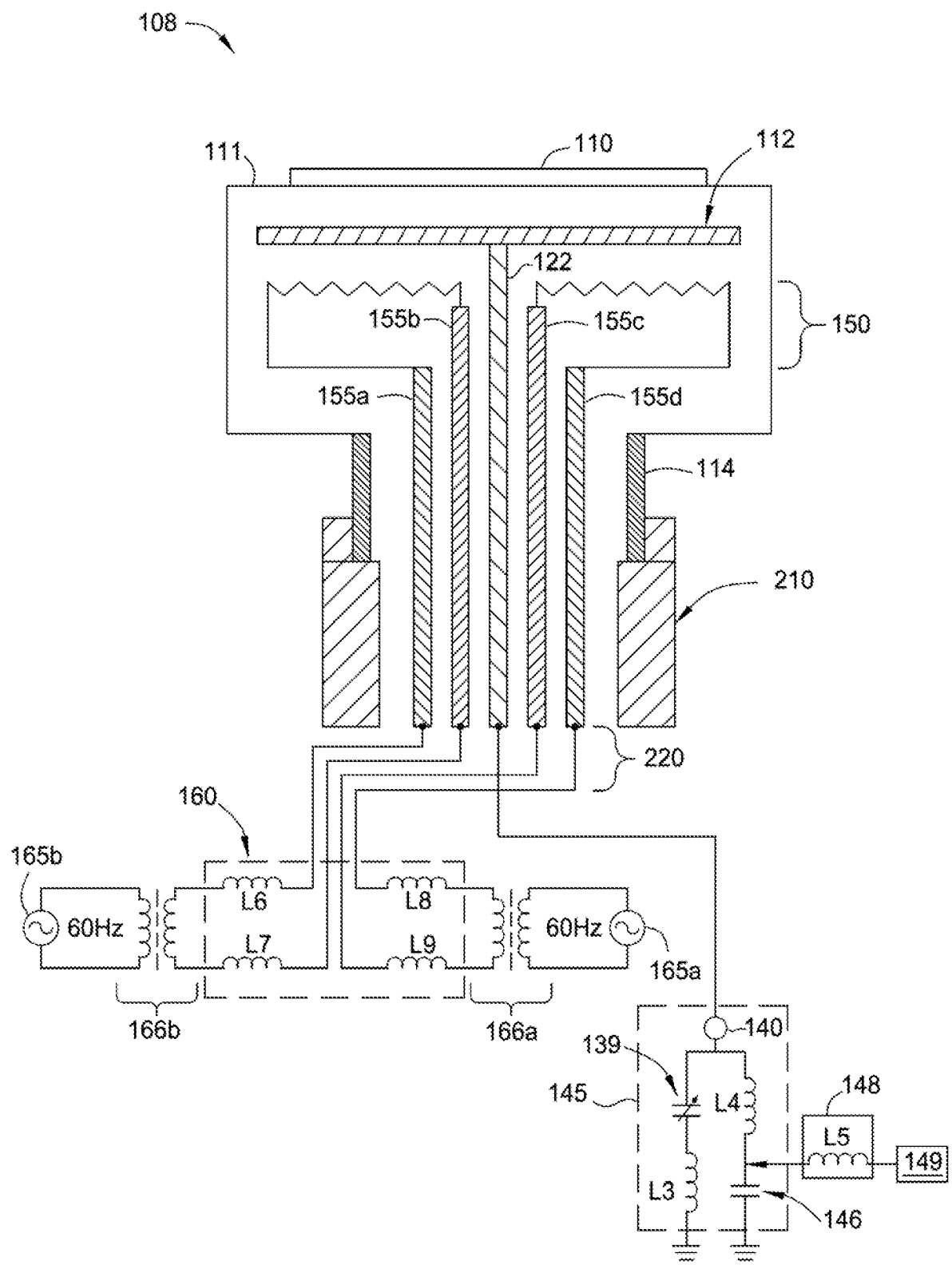
FIG. 2 is a schematic view of a substrate support pedestal, incorporating an RF filter according to one implementation described herein.

FIG. 2 is a schematic view of the pedestal 108, incorporating the RF filters 148, 160 according to one implementation described herein. The pedestal 108 may generally be used in a plasma processing apparatus, such as the apparatus described herein with respect to FIG. 1.

Pedestal 108 includes a tuning assembly comprising tuning electrode 112, RF rod 122, RF tuner 145, RF filter 148 and power supply 149. Pedestal 108 also includes a heating assembly comprising a plurality of heating elements 150. The heating elements may be distributed among a plurality of heating zones that are used to adjust the temperature profile across the substrate during processing. The plurality of heating zones may include an inner heating zone and an outer heating zone. The heating elements 150 are coupled through conductive rods 155a-d (collectively 155) to one or more RF filters 160. In one implementation, each of the conductive rods 155a-d is coupled to a respective RF filter 160, which may have the same or different properties. Groups of rods may correspond to different heating zones; for example, conductive rods 155b and 155c correspond to the heating elements of the inner heating zone, while conductive rods 155a and 155d correspond to heating elements of an outer heating zone. In one implementation, two conductive rods 155 correspond to a particular zone. For example, the heating power source 165 delivers AC power through RF filters 160 into a first rod of the two rods; the AC power travels through the first rod and heating elements 150 before returning through the second rod and RF filter 160 to ground.

Components of the heating assembly will generally have non-zero impedance that reflects both the intrinsic electrical properties of the components and the proximity to other components in the pedestal or plasma processing apparatus. For example, heating elements 150 and conductive rods 155 may couple RF energy from tuning assembly components during operation. The resistive portion of components' impedance is typically a non-zero value that is not affected by changes in operating frequency and is not able to be compensated for during processing. Therefore, for ease of description, resistive components are not depicted in FIG. 2.

To provide greater efficiency and greater control of the application of RF energy for depositing films onto or removing material from a substrate, ideally a maximum amount of the RF energy delivered by the powered gas distribution manifold will be coupled through the wall of the chamber body 102 and tuning assembly to ground, with no charge coupled into the heating assembly or into other components (i.e., RF leakage). Therefore, it is advantageous to reduce the impedance of the tuning assembly to a minimum value, and to increase the impedance of the heating assembly (e.g., heating elements 150 and one or more conductive rods). As discussed above, the components may all include some real, non-zero impedance (i.e., resistance) that cannot be compensated for during processing. However, the reactance of different components may be controlled by adjusting capacitive or inductive elements within the tuning assembly and the heating assembly.

To reduce the impedance of the tuning assembly to a minimum value and couple more of the delivered RF energy into the tuning assembly, components of RF tuner 145 may be adjusted to compensate for the reactance of the tuning assembly components at the operating frequency. For example, the capacitance of the variable capacitor 139 may be tuned when the tuning assembly has a positive reactance value for a particular frequency. The negative reactance provided by the variable capacitor 139 may thus compensate for the positive reactance.

The RF filter 148 is configured to block RF energy from reaching the power supply 149. In one implementation, the RF filter 148 includes at least one air core inductor L5 as described herein.

To increase the impedance of the heating assembly, one or more RF filters 160 are coupled to the conductive rods 155a-d. The RF filter 160 is configured to block RF energy from reaching the heating power source 165.

The RF filters 160 may be coupled to conductive rods 155 though conductive connections 220 near the pedestal base 210. In one implementation, the conductive connections 220 may include a short rigid lead for each rod, so that each RF filter 160 is directly coupled to each respective rod or disposed proximate to the pedestal base 210 and to the respective rods. Further, each conductive connection 220 may be maximally spaced apart to minimize capacitive coupling between connections. It is believed that connections that include a flexible and/or shielded multi-conductor cable disposed between the rods and the filter may introduce additional impedance and may provide a shunt path for RF or other signals, as each conductor will have resistive properties and may have coupling with the other conductors and with the grounded shield. Therefore, in some implementations, it is desirable to position the RF filter as close to the rods as mechanically feasible, and in some cases directly coupling the RF filter to each of the rods.

In one implementation, the RF filter 160 may have its electrical components selected to provide a desired resonance frequency for the RF filter 160. In one implementation, the RF filter 160 includes at least one air core inductor L6, L7, L8, L9 as described herein. The air core inductors L6, L7, L8, and L9 may be designed and positioned to provide a desired resonance frequency for the RF filter 160. The air core inductors L6, L7, L8, and L9 may be inserted in series on the conductive connections 220. The air core conductors L6, L7, L8, and L9 may be positioned within a grounded metal enclosure, which, in some cases, surrounds the various circuit elements of the RF filter 160. The air core inductors L6, L7, L8, and L9 may be electrically coupled with the power supply 165a, 165b via transformers 166a, 166b.

Any two individual resonant filters disclosed herein can be connected in series to achieve a dual-frequency resonant filter. It is also conceivable that multiple resonant filters can be built on difference sections of the same dielectric core. Multiple resonant frequencies may be generated using various combinatorial techniques to accommodate multiple operating frequencies.

FIG. 3 is a perspective view of an air core inductor 300 according to one implementation described herein. FIG. 4 is a top view of the air core inductor 300 of FIG. 3 according to one implementation described herein. FIG. 5 is a cross-section view of the air core inductor 300 taken along line A-A of FIG. 4 according to one implementation described herein. The air core inductor 300 comprises a first helical coil section 310 and a second helical coil section 320 wound upon an elongated core member 330. The second helical coil section 320 surrounds and extends along in a spaced relation to the first helical coil section 310. Thus the first helical coil section 310 and the second helical coil section 320 extend along the same longitudinal axis 360 with the first helical coil section 310 being within the second helical coil section 320.

Figure 6:
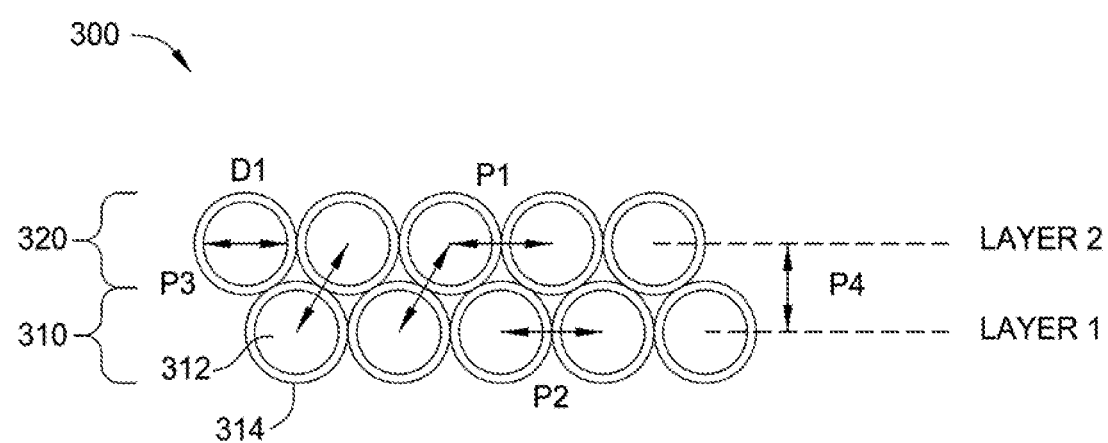
FIG. 6 is a schematic cross section view of a portion of the air core inductor of FIG. 3.

The air core inductor 300 is a multi-layer structure. The air core inductor 300 may contain any suitable number of layers. As depicted in FIG. 6, the first helical coil section 310 forms a first layer and the second helical coil section 320 forms a second layer.

In one implementation, the first helical coil section 310 and the second helical coil section 320 are each formed of a wire 312 of an electrically conductive metal coated with an insulating material 314. In one implementation, the first helical coil section 310 and the second helical coil section 320 are electrically and mechanically connected at one end of each of the helical coil sections 310, 320. In one implementation, the first helical coil section 310 and the second helical coil section 320 have terminals 340, 350 extending from their other ends. In one implementation, the terminals 340, 350 are spaced apart and extend substantially perpendicular to the longitudinal axis 360.

In one implementation, the first helical coil section 310 and the second helical coil section 320 are formed of a single, continuous length of a wire of an electrically conductive metal with terminals 340, 350 extending from each end of the wire.

Each of the first helical coil section 310 and the second helical coil section 320 includes the wire 312 coated with an insulating material 314. The wire 312 is of a suitable gauge having a predetermined thickness. Any suitable electrically conductive material may be used. Exemplary conductive materials include copper and the like. The insulating material 314 has a predetermined thickness. Any suitable insulating material having a predetermined thickness may be used. Exemplary insulating materials include polyimide, aromatic polyimide, liquid crystal polymer, polytetrafluoroethylene (PTFE), polyether ether ketone (PEEK), ethylene tetrafluoroethylene (ETFE), Parylene, tantalum oxides, any nano-dielectric coating, perfluoroalkoxy alkanes (PFA), fluorinated ethylene propylene (FEP), Polyurethane, polyurethane with self-bonding overcoat, polyamide, polyvinyl acetal, polyvinyl acetal overcoated with polyamide, polyurethane overcoated with polyamide, epoxy, polyester (amide) (imide) overcoated with polyamide, polyester (amide) (imide), silicone-treated glass fiber, polyamide-imide, thermoplastic compounds, polyvinylchloride (PVC), polyolefin class: {LDPE, HDPE, TPO, TPR, polyolefin alloys}, LDPE low density, HDPE high density, polypropylene (PP), thermoplastic fluoropolymers, TEFLON FEP, Tefzel ETFE, Kynar PVDF, TEFLON PFA, Halar ECTFE, PTFE Teflon, PTFE Teflon film, XLPE & XLPVC, silicone rubber, Polyimide Kapton film, Polyester Mylar film, Kaladex PEN film, and a crosslinked polyalkenepoly.

The first helical coil section 310 has a predetermined number of coil turns. The second helical coil section 320 has a predetermined number of coil turns. In one implementation, the predetermined number of coil turns of the first helical coil section 310 and the predetermined number of coil turns of the second helical coil section 320 are the same. In one implementation, the predetermined number of coil turns of the first helical coil section 310 is greater than the predetermined number of coil turns of the second helical coil section 320. In one implementation, the predetermined number of coil turns of the first helical coil section 310 is less than the predetermined number of coil turns of the second helical coil section 320.

The second helical coil section 320 is positioned to overlap the first helical coil section 310 both axially and radially so that the air core inductor is resonant at a predetermined frequency. The second helical coil section 320 has an inner diameter slightly smaller than the outer diameter of the first helical coil section 310. The insulating material 314 extends radially between the first helical coil section 310 and the second helical coil section 320. In one implementation, the coil turns of the first helical coil section 310 and the coil turns of the second helical coil section 320 are wound in the same direction. In another implementation, the coil turns of the first helical coil section 310 and the coil turns of the second helical coil section 320 are wound in opposite directions.

The elongated core member 330 may be any suitable shape. In one implementation, the elongated core member 330 is generally cylindrically shaped. The elongated core member 330 is composed of a non-magnetic material. In the implementation of FIG. 3, the elongated core member 330 has a one-piece structure. It should be understood that the elongated core member 330 may include multiple pieces, for example, a two-piece structure. The elongated core member 330 may be constructed of any suitable non-magnetic material. Exemplary non-magnetic materials include polyimide, aromatic polyimide, liquid crystal polymer, polytetrafluoroethylene (PTFE), polyether ether ketone (PEEK), ETFE, Parylene, tantalum oxides, any nano-dielectric coating, PFA, FEP, Polyurethane, polyurethane with self-bonding overcoat, polyamide, polyvinyl acetal, polyvinyl acetal overcoated with polyamide, polyurethane overcoated with polyamide, epoxy, polyester (amide) (imide) overcoated with polyamide, polyester (amide) (imide), silicone-treated glass fiber, polyamide-imide, thermoplastic compounds, polyvinylchloride (PVC), polyolefin class: {LDPE, HDPE, TPO, TPR, polyolefin alloys}, LDPE low density, HDPE high density, polypropylene (PP), thermoplastic fluoropolymers, TEFLON FEP, Tefzel ETFE, Kynar PVDF, TEFLON PFA, Halar ECTFE, PTFE Teflon, PTFE Teflon film, XLPE & XLPVC, silicone rubber, Polyimide Kapton film, Polyester Mylar film, Kaladex PEN film, and a crosslinked polyalkenepoly. It should be understood that although the implementation of FIG. 3 depicts the air core inductor 300 as having an elongated core, the elongated core may be replaced by an air gap.

FIG. 6 is a schematic cross section view of a portion of the air core inductor 300 of FIG. 3. In FIG. 6, D1 represents the diameter of the wire 312. P1, P2, P3 and P4 represent the pitch between any two neighboring wires that collectively produce the desirable mutual conductance and capacitance to achieve the target resonant frequency. The pitches between neighboring wires may or may not be the same. One of ordinary skill in the art may develop equivalent winding schemes that achieve a similar resonant frequency and the desired quality factor using the same type of wires or different wires.

The frequency to which the coil sections 310 and 320 are responsive in assembly with each other is determined by the usual parameters for such coils. Some of the usual parameters for determination of the induction are the material of which the wires are made, the diameter of the wire, the number of turns of the wire, and the proximity and orientation of the coils with respect to each other. In the case of the coils assembled as shown in FIGS. 3-6, some of the parameters for determination of capacitance are the distance the coils are overlapping each other, the composition and thickness of the insulating material on the wire, and the distance between the wire portions of the coils.

In one specific implementation, each coil section is formed from 24 AWG enameled copper wire. The copper wire may have a diameter between about 0.020 inches and about 0.025 inches. The first coil section may have between 20 and 25 turns. The second coil section may have between 18 and 23 turns. The elongated core may comprise PEEK material. The elongated core may have a diameter between 0.30 inches and 0.35 inches. In assembly, the coils may be adjusted to provide a combined inductance and distributed capacitance at an operating frequency of about 12.7 MHz and the quality factor is approximately 100.

The minimum inductance and range of inductance variation of the air core inductor 300 can be set by adjusting the physical parameters of the air core inductor 300, including wire length l, wire diameter D, insulation type, wire gauge and construction, helix diameter, and twist per inch T. This air core inductor 300 may be scaled to any frequency of operation and inductance as would be appreciated by those skilled in the art.

Figure 7:
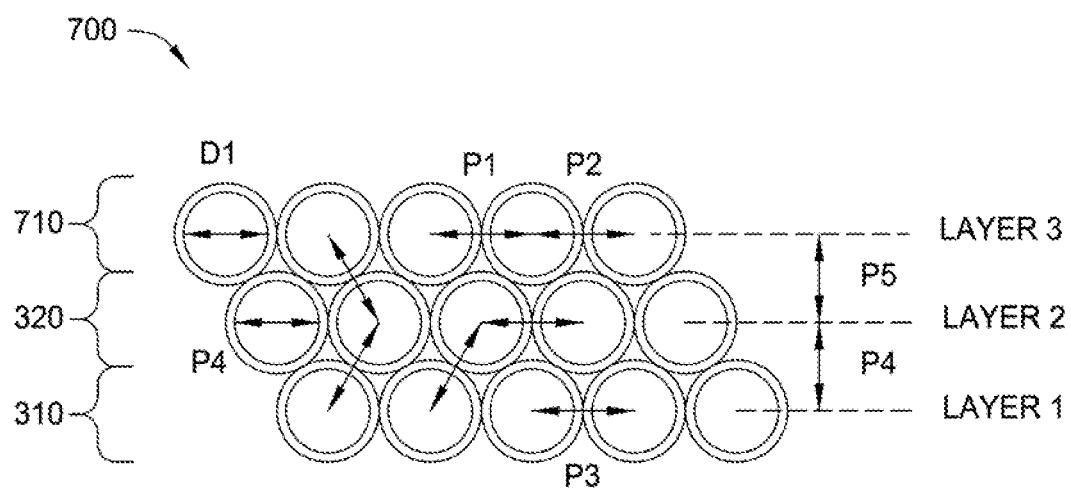
FIG. 7 is a schematic cross section view of another air core inductor according to another implementation described herein.

FIG. 7 is a schematic cross section view of another air core inductor 700 according to another implementation described herein. The air core inductor 700 is similar to the air core inductor 300 except that the air core inductor 700 is a tri-layer structure that includes a third helical coil section 710 that is positioned to overlap the second helical coil section 320 both axially and radially so that the air core inductor 700 is resonant at a predetermined frequency. In FIG. 7, D1 represents the diameter of the wire 312. Also, P1, P2, P3, P4, P5 and P6 represent the pitch between any two neighboring wires that collectively produce the desirable mutual conductance and capacitance to achieve the target resonant frequency. The pitches between neighboring wires may or may not be the same.

Figure 8:
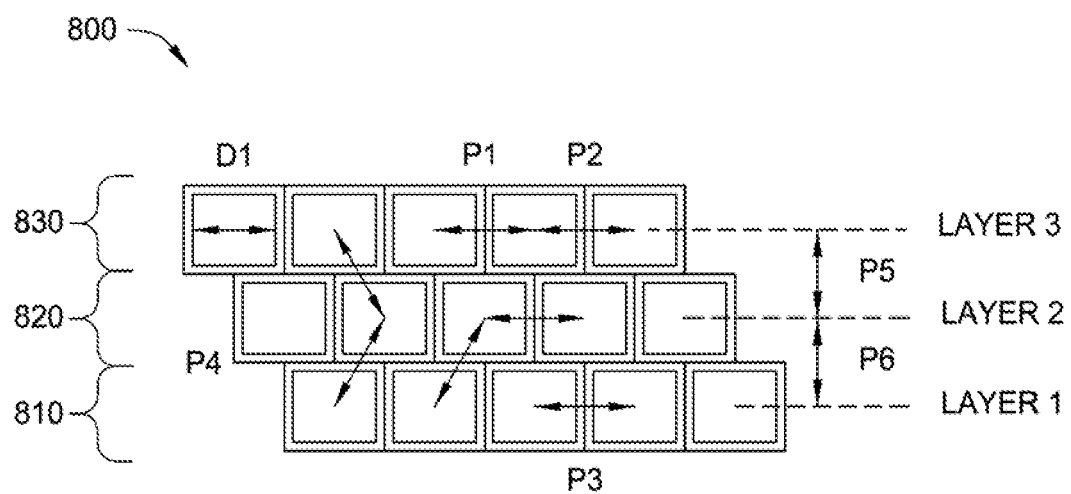
FIG. 8 is a schematic cross section view of another air core inductor according to another implementation described herein.

FIG. 8 is a schematic cross section view of another air core inductor 800 according to another implementation described herein. The air core inductor 800 is similar to the air core inductor 700 except that the wire of each helical coil section 810, 820, 830 has a rectangular cross-section so that the air core inductor 800 is resonant at a predetermined frequency. It is believed that the cross-sectional shape of the wire also has a strong influence toward mutual coupling of the electric and magnetic field and therefore is another factor that may be used to achieve the desired target resonance frequency. For example, the mutual coupling would increase if a wire of a circular cross-section and of diameter D1 as shown in FIG. 7 was replaced with a wire having a rectangular cross-section and all other parameters and winding process being the same, resulting in a shift of the resonant frequency and a change of the quality factor as well.

Figure 9:
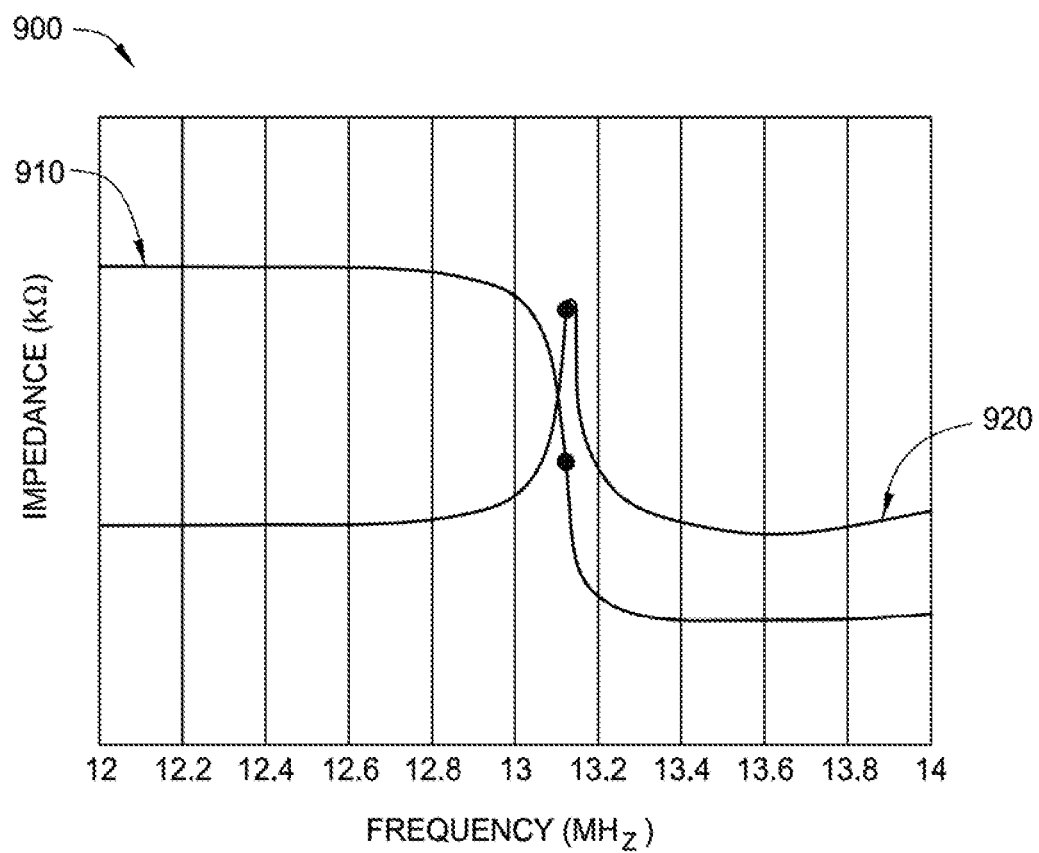
FIG. 9 is a graph illustrating the response of an RF filter containing an air core inductor designed according to implementations described herein.

FIG. 9 is a graph 900 illustrating the response of an RF filter containing an air core inductor designed according to implementations described herein. In this implementation, the resonance frequency of the of the air core inductor is 13.1 megahertz (MHz) and the operating frequency is approximately 13.1 MHz. Line 910 represents the self-resonant frequency of the air core inductor. Line 920 represents the operating frequency.

Based on a given (i.e., known) operating frequency, the resonance frequency for the RF filter may be selected in order to provide a desired impedance value of the RF filter at the operating frequency.

Based on the selected resonance frequency, one or more components of the RF filters described above may be selected. For example, and as described above, the RF filter 160 may include an air core inductor. To create an RF filter having the selected resonance frequency, parameters of the air core inductor may then be selected (such as a number of turns, a radius, a length, and so forth). Selecting an air core inductor for use in the RF filter may also include considering other electrical properties of the component at RF frequencies. For example, an air core inductor may also exhibit resistive and/or capacitive properties at RF frequencies. The air core inductors of the RF filter may thus be designed to account for these other properties in order to achieve a desired reactance value at the operating frequency. Of course, the RF filter may include other types of components (resistors, capacitors, etc.) or different combinations or configurations of these components.

As the air core inductors of the RF filter are installed, for example, into a heating assembly prior to operation of the plasma processing apparatus, the air core inductors of the RF filter may be positioned relative to each other, and/or relative to other components of the heating assembly, to achieve a desired reactance value for the RF filter circuit. Based on their positions and orientations, the air core inductors may have capacitive and/or inductive couplings with each other that may impact the frequency response of the RF filter. Additionally, the air core inductors may be installed into a protective enclosure, or into an assembly, that may have electrical characteristics that cause further couplings to impact the RF filter's frequency response. Therefore, the individual air core inductors of the RF filter may each be positioned so that the various couplings can be accounted for in the resonance frequency. Of course, this may be an iterative process, as moving one air core inductor may involve adjustment to the properties of the same air core inductors (e.g., selecting a different number of turns or length) or to other components.

As described above, to achieve a desired impedance of the RF filter for a particular operating frequency, the air core inductors of the RF filter may be selected (and appropriately positioned) to result in the selected filter resonance frequency. In most cases, the resonance frequency will differ from the operating frequency. However, to ensure that the impedance value is sufficiently large to prevent RF energy from coupling into the heating assembly, the filter resonance frequency should be selected relatively close to the operating frequency. In one implementation, the filter resonance frequency may be selected so that the operating frequency falls within a desired range of the resonance frequency. For example, the resonance frequency may be selected so that the operating frequency falls within ±5% (or ±10%) of the resonance frequency. Of course, the ranges could be specified as frequency differences (e.g., within 1 MHz) instead of percentages. In some cases, the resonance frequency may be selected so that the impedance of the RF filter circuit at the operating frequency is a certain desired percentage of the peak impedance. In one example, the resonance frequency may be selected so that the impedance of the RF filter at the operating frequency is between about 10% and 100% of the peak impedance, such as an impedance of between about 15% and 60% of the peak impedance. In one configuration, the operating frequency is within a predetermined range that is positioned about the resonant frequency of the RF filter. In one example, the operating frequency is within a predetermined range that is defined as being twice the difference of the resonant frequency and a first frequency at which the measured reactance is within 10% of the peak reactance.

Beyond keeping the operating frequency within a predetermined range of the resonance frequency, the resonance frequency may also be advantageously selected so that the operating frequency is at least a minimum range from the resonance frequency. Therefore, it may be advantageous to select a RF filter resonance frequency so that the operating frequency would fall outside some minimum range of the resonance frequency. For example, the resonance frequency may be selected so that the operating frequency is at least ±2.5% (or ±3.5%) of the resonance frequency. In another example, the resonance frequency may be selected so that the operating frequency is at least ±2.5% (or ±3.5%) of the resonance frequency, but less than a frequency at which the impedance of the RF filter drops to a level of about 10% of the peak impedance.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A plasma processing apparatus, comprising:
a chamber body and a gas distribution manifold enclosing a processing volume, the gas distribution manifold connected to a RF power source;
a substrate support pedestal disposed in the processing volume and having a substrate-supporting surface;
a heating assembly comprising one or more heating elements disposed within the substrate support pedestal and operable to control a temperature profile of the substrate supporting surface; and
a tuning assembly comprising:
a tuning electrode that is disposed within the substrate support pedestal between the one or more heating elements and the substrate-supporting surface, an electric field is generated in the chamber between the powered gas distribution manifold and the tuning electrode;
a radio frequency (RF) conductive rod coupled with the tuning electrode;
an RF tuner electrically coupled with the tuning electrode via the RF conductive rod, wherein the RF tuner comprises a variable capacitor connected with a first inductor and the variable capacitor is terminated to ground through the first inductor;
an RF filter comprising an air core inductor and electrically coupled with the tuning electrode via the RF tuner and the RF conductive rod, the air core inductor, comprising:
a first helical coil section having a predetermined number of coil turns;
a second helical coil section having a predetermined number of coil turns and positioned to overlap the first helical coil section both axially and radially, wherein the first helical coil section and the second helical coil section share a common longitudinal axis;
a first terminal extends from an end of the first helical coil section; and
a second terminal extends from an end of the second helical coil section; and a power supply electrically coupled with the tuning electrode via the RF tuner, the RF filter, and the tuning electrode, wherein the RF filter is without capacitors,
wherein the RF tuner further comprises a second inductor electrically connected with a capacitor, and wherein the second inductor and the capacitor are electrically coupled in parallel to the variable capacitor connected with the first inductor, to provide a path for low frequency RE to ground.

2. The apparatus of claim 1, wherein the second helical coil section has an inner diameter smaller than an outer diameter of the first helical coil section.

3. The apparatus of claim 2, wherein insulating material extends radially between the first helical coil section and the second helical coil section.

4. The apparatus of claim 1, wherein the predetermined number of coil turns of the first helical coil section and the predetermined number of coil turns of the second helical coil section are the same.

5. The apparatus of claim 1, wherein the predetermined number of coil turns of the first helical coil section is greater than the predetermined number of coil turns of the second helical coil section.

6. The apparatus of claim 1, wherein coil turns of the first helical coil section and coil turns of the second helical coil section are wound in the same direction.

7. The apparatus of claim 1, wherein the air core inductor further comprises an elongated non-magnetic core assembly, wherein the first helical coil section and the second helical coil section encircle the elongated non-magnetic core assembly.

8. The apparatus of claim 1, wherein the air core inductor has an air gap and the first helical coil section and the second helical coil section encircle the air gap.

9. A substrate support assembly for a plasma processing apparatus, comprising:
a substrate support pedestal having a substrate-supporting surface;
a heating assembly comprising one or more heating elements disposed within the substrate support pedestal operable to control a temperature profile of the substrate-supporting surface; and
a tuning assembly comprising:
a tuning electrode that is disposed within the substrate support pedestal;
a radio frequency (RF) conductive rod coupled with the tuning electrode;
an RF tuner electrically coupled with the tuning electrode via the RF conductive rod, wherein the RE tuner comprises a variable capacitor connected with a first inductor and the variable capacitor is terminated to ground through the first inductor;
an RF filter comprising an air core inductor and electrically coupled with the tuning electrode via the RF tuner and the RF conductive rod, the air core inductor, comprising:
a first helical coil section having a predetermined number of coil turns;
a second helical coil section having a predetermined number of coil turns and positioned to overlap the first helical coil section both axially and radially, wherein the first helical coil section and the second helical coil section share a common longitudinal axis;
a first terminal extends from a first end of the first helical coil section; and a second terminal extends from a second end of the second helical coil section; and a power supply electrically coupled with the tuning electrode via the RF tuner, the RF filter, and the tuning electrode, wherein the RF filter is without capacitors, wherein the RF tuner further comprises a second inductor electrically connected with a capacitor, and wherein the second inductor and the capacitor are electrically coupled in parallel to the variable capacitor connected with the first inductor, to provide a path for low frequency RF to ground.

10. The substrate support assembly of claim 9, wherein the second helical coil section has an inner diameter smaller than an outer diameter of the first helical coil section.

11. The substrate support assembly of claim 10, wherein insulating material extends radially between the first helical coil section and the second helical coil section.

12. The substrate support assembly of claim 9, wherein the air core inductor further comprises an elongated non-magnetic core assembly, wherein the first helical coil section and the second helical coil section encircle the elongated non-magnetic core assembly.

13. The substrate support assembly of claim 9, wherein the air core inductor has an air gap and the first helical coil section and the second helical coil section encircle the air gap.

14. The plasma processing apparatus of claim 9, where the power supply is electrically coupled via the RF filter between the second inductor and the capacitor.

15. A substrate support assembly for a plasma processing apparatus comprising:

a substrate support pedestal having a substrate-supporting surface;

a heating assembly comprising one or more heating elements disposed within the substrate support pedestal and operable to control a temperature profile of the substrate-supporting surface; and a tuning assembly comprising:
 a tuning electrode that is disposed within the substrate support pedestal;
 a radio frequency (RF) conductive rod coupled with the tuning electrode;
 an RF tuner electrically coupled with the tuning electrode via the RF conductive rod, wherein the RF tuner comprises a variable capacitor connected with a first inductor and the variable capacitor is terminated to ground through the first inductor;
 an RF filter comprising an air core inductor and electrically coupled with the tuning electrode via the RF tuner and the RF conductive rod, wherein the air core inductor comprises:
  a first helical coil section having a predetermined number of coil turns;
  a second helical coil section having a predetermined number of coil turns and positioned to overlap the first helical coil section both axially and radially, wherein the first helical coil section and the second helical coil section share a common longitudinal axis, and
  wherein the first helical coil section and the second helical coil section are formed of a single, continuous length of wire;
 a first terminal extends from a first end of the wire; and
 a second terminal extends from a second end of the wire, wherein the first terminal and the second terminal extend from a first end of the air core inductor; and
 a power supply electrically coupled with the tuning electrode is the RF tuner, the RF filter, and the tuning electrode, wherein the RF filter is without capacitors,
 wherein the RF tuner further comprises a second inductor electrically, connected with a capacitor, and wherein the second inductor and the capacitor are electrically coupled in parallel to the variable capacitor, to provide a path for low frequency RF to ground.

16. The substrate support assembly of claim 15, wherein the air core inductor further comprises an elongated non-magnetic core assembly, wherein the first helical coil section and the second helical coil section encircle the elongated non-magnetic core assembly.

17. The substrate support assembly of claim 15, wherein the air core inductor has an air gap and the first helical coil section and the second helical coil section encircle the air gap.

18. The substrate support assembly of claim 15, wherein the second helical coil section has an inner diameter smaller than an outer diameter of the first helical coil section.

19. The substrate support assembly of claim 15, wherein insulating material extends radially between the first helical coil section and the second helical coil section.

* * * * *

UNITED STATES PATENT AND TRADEMARK OFFICE
CERTIFICATE OF CORRECTION

PATENT NO. : 10,879,041 B2
APPLICATION NO. : 15/214063
DATED : December 29, 2020
INVENTOR(S) : Zheng John Ye et al.

It is certified that error appears in the above-identified patent and that said Letters Patent is hereby corrected as shown below:

In the Drawings

On Sheet 6 of 6, in Figure 9, Line 1 (X-Axis), delete "(MH$_z$)," and insert -- (MHz), --, therefor.

In the Specification

In Column 4, Line 27, delete "simultanuously," and insert -- simultaneously, --, therefor.

In Column 4, Line 38, delete "resonanent" and insert -- resonant --, therefor.

In Column 5, Line 3, delete "advantanges." and insert -- advantages. --, therefor.

In Column 5, Line 44, delete "arbitary" and insert -- arbitrary --, therefor.

In Column 5, Line 56, delete "thereoff" and insert -- thereof --, therefor.

In Column 13, Line 57, delete "of the of the" and insert -- of the --, therefor.

In the Claims

In Column 15, Line 37, in Claim 1, delete "substrate supporting" and insert -- substrate-supporting --, therefor.

In Column 16, Line 10, in Claim 1, delete "RE" and insert -- RF --, therefor.

In Column 16, Line 50, in Claim 9, delete "RE" and insert -- RF --, therefor.

In Column 17, Line 29, in Claim 14, delete "plasma processing apparatus" and insert -- substrate support assembly --, therefor.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,879,041 B2

In Column 17, Line 29, in Claim 14, delete "where" and insert -- wherein --, therefor.

In Column 17, Line 33, in Claim 15, delete "apparatus" and insert -- apparatus, --, therefor.

In Column 18, Line 23, in Claim 15, delete "is" and insert -- via --, therefor.

In Column 18, Line 26, in Claim 15, delete "electrically," and insert -- electrically --, therefor.